United States Patent
Hikichi

(10) Patent No.: US 10,571,528 B2
(45) Date of Patent: Feb. 25, 2020

(54) MAGNETIC SENSOR CIRCUIT

(71) Applicant: ABLIC Inc., Chiba-shi, Chiba (JP)

(72) Inventor: Tomoki Hikichi, Chiba (JP)

(73) Assignee: ABLIC INC., Chiba (JP)

( * ) Notice: Subject to any disclaimer, the term of this patent is extended or adjusted under 35 U.S.C. 154(b) by 70 days.

(21) Appl. No.: 16/006,364

(22) Filed: Jun. 12, 2018

(65) Prior Publication Data

US 2018/0364314 A1    Dec. 20, 2018

(30) Foreign Application Priority Data

Jun. 14, 2017  (JP) ................................ 2017-116858
May 11, 2018  (JP) ................................ 2018-091806

(51) Int. Cl.
   *G01R 33/09* (2006.01)
   *G01R 33/00* (2006.01)
   *H03F 3/45* (2006.01)

(52) U.S. Cl.
   CPC ..... *G01R 33/0023* (2013.01); *G01R 33/0005* (2013.01); *H03F 3/45475* (2013.01); *H03F 2200/129* (2013.01); *H03F 2203/45116* (2013.01); *H03F 2203/45151* (2013.01); *H03F 2203/45528* (2013.01)

(58) Field of Classification Search
   CPC ...... G01R 19/0023; G01R 1/30; G01R 33/09; G01R 29/0878
   See application file for complete search history.

(56) References Cited

U.S. PATENT DOCUMENTS

| | | | | |
|---|---|---|---|---|
| 5,568,047 A | * | 10/1996 | Staver | H01F 38/32 324/127 |
| 7,535,215 B2 | | 5/2009 | Forster | |
| 2003/0202272 A1 | * | 10/2003 | Makita | G11B 5/02 360/67 |
| 2010/0321105 A1 | * | 12/2010 | Romero | H03H 19/004 327/554 |
| 2014/0043876 A1 | * | 2/2014 | Tsou | H02M 7/04 363/78 |

FOREIGN PATENT DOCUMENTS

| JP | 2009-150732 | 7/2009 |
|---|---|---|
| JP | 2015-132574 | 7/2015 |

* cited by examiner

*Primary Examiner* — Alesa Allgood
(74) *Attorney, Agent, or Firm* — Brinks Gilson & Lione

(57) ABSTRACT

A magnetic sensor circuit includes a vertical-magnetic-field sensor, a horizontal-magnetic-field sensor, a control circuit controlling a first measurement mode and a second measurement mode through switching, a first feedback circuit configuring a feedback loop of a first operational amplifier, a second feedback circuit configuring a feedback loop of a second operational amplifier, a connecting circuit, and at least any one of a first switch switching an impedance of the first feedback circuit, a second switch switching an impedance of the second feedback circuit, and a third switch switching an impedance of the connecting circuit those which controlled by the control circuit. The magnetic sensor circuit detects magnetic fields in nearly the same two-axial sensitivity without using a magnetic converging plate while reducing an occupation area of the amplifier circuit.

4 Claims, 11 Drawing Sheets

MAGNETIC SENSOR CIRCUIT

RELATED APPLICATIONS

This application claims priority under 35 U.S.C. § 119 to Japanese Patent Application Nos. 2017-116858 filed on Jun. 14, 2017 and 2018-091806 filed on May 11, 2018, the entire content of which are hereby incorporated by reference.

BACKGROUND OF THE INVENTION

Field of the Invention

The present invention relates to a magnetic sensor circuit.

Background Art

In order to detect the speed and direction of rotations of various rotating mechanisms, there has heretofore been known a method of converting a horizontal magnetic field applied from outside to a vertical magnetic field by using a magnetic converging plate configured in an integrated circuit to thereby detect the vertical and horizontal magnetic fields by a vertical-magnetic-field sensor (refer to, for example, Japanese Patent Application Laid-Open No. 2009-150732). There has also been known a configuration of converting a horizontal magnetic field applied from outside to a vertical magnetic field by using a magnetic converging plate configured in an integrated circuit to thereby detect the vertical and horizontal magnetic fields by a vertical-magnetic-field sensor and amplifying a signal indicative of the detected vertical magnetic field and a signal indicative of the detected horizontal magnetic field by using a common amplifier circuit (refer to, for example, Japanese Patent Application Laid-Open No. 2015-132574). Further, there has been known a configuration of detecting vertical and horizontal magnetic fields applied from outside by using a vertical-magnetic-field sensor and a horizontal-magnetic-field sensor, respectively and amplifying a signal indicative of the detected vertical magnetic field and a signal indicative of the detected horizontal magnetic field by using a common amplifier circuit (refer to, for example, U.S. Pat. No. 7,535,215).

SUMMARY OF THE INVENTION

Here, in the prior art described in Japanese Patent Application Laid-Open No. 2009-150732 and Japanese Patent Application Laid-Open No. 2015-132574, since only the same kind of sensors are used in each magnetic sensor circuit, it is possible to obtain nearly the same sensitivities along respective detection axes. On the other hand, a special manufacturing process different from a general semiconductor manufacturing process is necessary for lamination of a magnetic converging plate. Hence, it is difficult to reduce the cost required for manufacture.

Further, in the prior art described in Japanese Patent Application Laid-Open No. 2015-132574, since only the same kind of sensor is used, the detected vertical and horizontal magnetic fields can be amplified by the common amplifier circuit. On the other than, in the prior art described in U.S. Pat. No. 7,535,215, it is difficult to obtain nearly the same sensitivities for the vertical magnetic field and the horizontal magnetic field through analog processing by the use of the common amplifier circuit for amplifying each detected signal since the vertical-magnetic-field sensor and the horizontal-magnetic-field sensor each having different magnetic field detection sensitivity are used.

Though an amplifier circuit for the signal indicative of the vertical magnetic field and an amplifier circuit for the signal indicative of the horizontal magnetic field might be respectively provided separately as a measure against the difficulty, low power consumption is difficult to obtain. Further, there is a case where the correction of the vertical magnetic field sensitivity and the horizontal magnetic field sensitivity by the analog processing is not performed. In this case, however, the correction thereof in a post-stage digital processing unit will incur an increase in process cost due to the use of a fine process and an increase in cost due to an increase in occupation area.

The present invention provides a magnetic sensor circuit capable of detecting two-axial magnetic fields in nearly the same sensitivity without using a magnetic converging plate while reducing an occupation area for the amplifier circuit.

A magnetic sensor circuit according to an embodiment of the present invention includes: a vertical-magnetic-field sensor providing a differential voltage corresponding to a vertical magnetic field; a horizontal-magnetic-field sensor providing a differential voltage corresponding to a horizontal magnetic field; a first operational amplifier; a second operational amplifier; a first switch connected between one of output terminals of the vertical-magnetic-field sensor and one of input terminals of the first operational amplifier; a second switch connected between another one of output terminals of the vertical-magnetic-field sensor and one of input terminals of the second operational amplifier; a third switch connected between one of output terminals of the horizontal-magnetic-field sensor and the one of input terminals of the first operational amplifier; a fourth switch connected between another one of output terminals of the horizontal-magnetic-field sensor and the one of input terminals of the second operational amplifier; a first feedback circuit connected between an output terminal of the first operational amplifier and another one of input terminals of the first operational amplifier; a second feedback circuit connected between an output terminal of the second operational amplifier and another one of input terminals of the second operational amplifier; a connecting circuit connected between the other one of input terminals of the first operational amplifier and the other one of input terminals of the second operational amplifier; a control circuit configured to control a switching between a first measurement mode for measuring the vertical magnetic field and a second measurement mode for measuring the horizontal magnetic field; and at least any one of a fifth switch configured to switch an impedance of the first feedback circuit, a sixth switch configured to switch an impedance of the second feedback circuit, and a seventh switch configured to switch an impedance of the connecting circuit, in the first measurement mode the control circuit connecting the one of output terminal of the vertical-magnetic-field sensor and the one of input terminals of the first operational amplifier with the first switch, connecting the other one of output terminals of the vertical-magnetic-field sensor and the one of input terminals of the second operational amplifier with the second switch, and controlling a switching of at least any one of the fifth switch, the sixth switch, and the seventh switch, and in the second measurement mode the control circuit connecting the one of output terminal of the horizontal-magnetic-field sensor and the one of input terminals of the first operational amplifier with the third switch, connecting the other one of output terminals of the horizontal-magneticfield sensor and the one of input terminals of the second operational amplifier with the fourth switch, and controlling a switching of at least any one of the fifth switch, the sixth switch, and the seventh switch.

According to the present invention, a magnetic sensor circuit capable of detecting two-axial magnetic fields in nearly the same sensitivity can be provided without using a magnetic converging plate and while reducing an occupation area of the amplifier circuit.

DETAILED DESCRIPTION OF THE EMBODIMENTS

First Embodiment

FIG. 1 is a diagram illustrating an example in which a vertical-magnetic-field sensor 1 and a horizontal-magnetic-field sensor 2 respectively detect a magnetic field of a ring-shaped multipolar magnet 500.

The vertical-magnetic-field sensor 1 and the horizontal-magnetic-field sensor 2 are respectively arranged in positions where they can detect magnetic fields (B illustrated in FIGS. 1A to 1D) generated from the ring-shaped multipolar magnet 500. The vertical-magnetic-field sensor 1 and the horizontal-magnetic-field sensor 2 respectively detect a change in the magnetic field accompanying the rotation of the ring-shaped multipolar magnet 500. In the following description, an XYZ orthogonal coordinate system may be used to describe the direction of the magnetic field. In the XYZ orthogonal coordinate system, the Y axis indicates a longitudinal direction of a surface on which the vertical-magnetic-field sensor 1 and the horizontal-magnetic-field sensor 2 are arranged. The X axis indicates a lateral direction, i.e., a horizontal direction of the surface on which the vertical-magnetic-field sensor 1 and the horizontal-magnetic-field sensor 2 are arranged. The Z axis indicates a height direction, i.e., vertical direction of the surface on which the vertical-magnetic-field sensor 1 and the horizontal-magnetic-field sensor 2 are arranged.

Further, in the present embodiment, the ring-shaped multipolar magnet 500 rotates counterclockwise as viewed from one side of the Y axis (as seen in −Y direction) around the rotating shaft parallel to the Y axis.

Figure 1A:
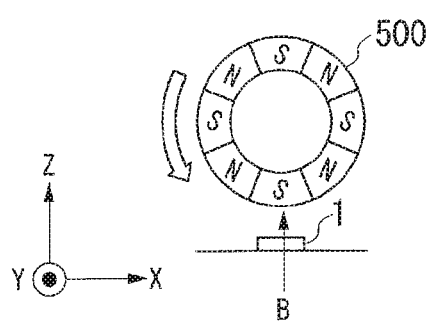
FIGS. 1A to 1D are diagrams illustrating an example in which a vertical-magnetic-field sensor and a horizontal-magnetic-field sensor respectively detect a magnetic field of a ring-shaped multipolar magnet.
Figure 1B:
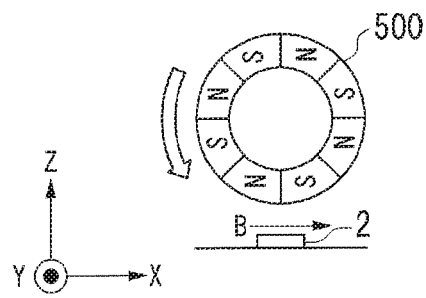
Figure 1C:
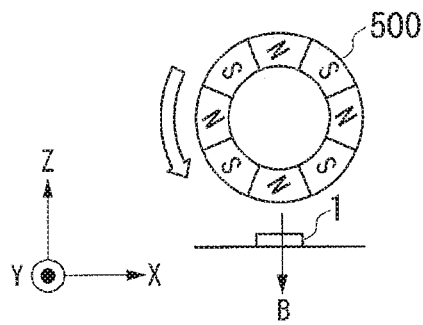
Figure 1D:
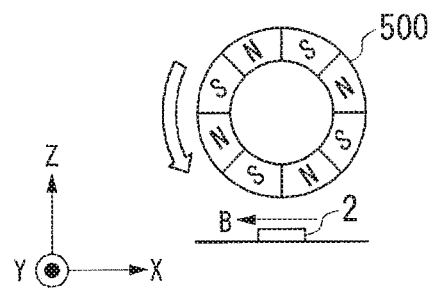

As illustrated in FIG. 1A and FIG. 1C, the vertical-magnetic-field sensor 1 detects a magnetic field in the vertical direction (hereinafter described simply as a vertical magnetic field) which is generated from the ring-shaped multipolar magnet 500. Also, as illustrated in FIG. 1B and FIG. 1D, the horizontal-magnetic-field sensor 2 detects a magnetic field in the horizontal direction (hereinafter described simply as a horizontal magnetic field) which is generated from the ring-shaped multipolar magnet 500.

Here, a difference may occur between magnetic field detection sensitivities of the vertical-magnetic-field sensor 1 and the horizontal-magnetic-field sensor 2 caused by the difference in an internal structure which configures each sensor. Specifically, in the vertical-magnetic-field sensor 1 and the horizontal-magnetic-field sensor 2, the former may be high in the magnetic field detection sensitivity. In this case, an amplification factor of a signal output in the detection of the vertical magnetic field by the vertical-magnetic-field sensor 1, and an amplification factor of a signal output in the detection of the horizontal magnetic field by the horizontal-magnetic-field sensor 2 are required to be different from each other. In the case described above, the amplification factor of the signal output from the vertical-magnetic-field sensor 1 is required to be lower than the amplification factor of the signal output from the horizontal-magnetic-field sensor 2.

Figure 2:
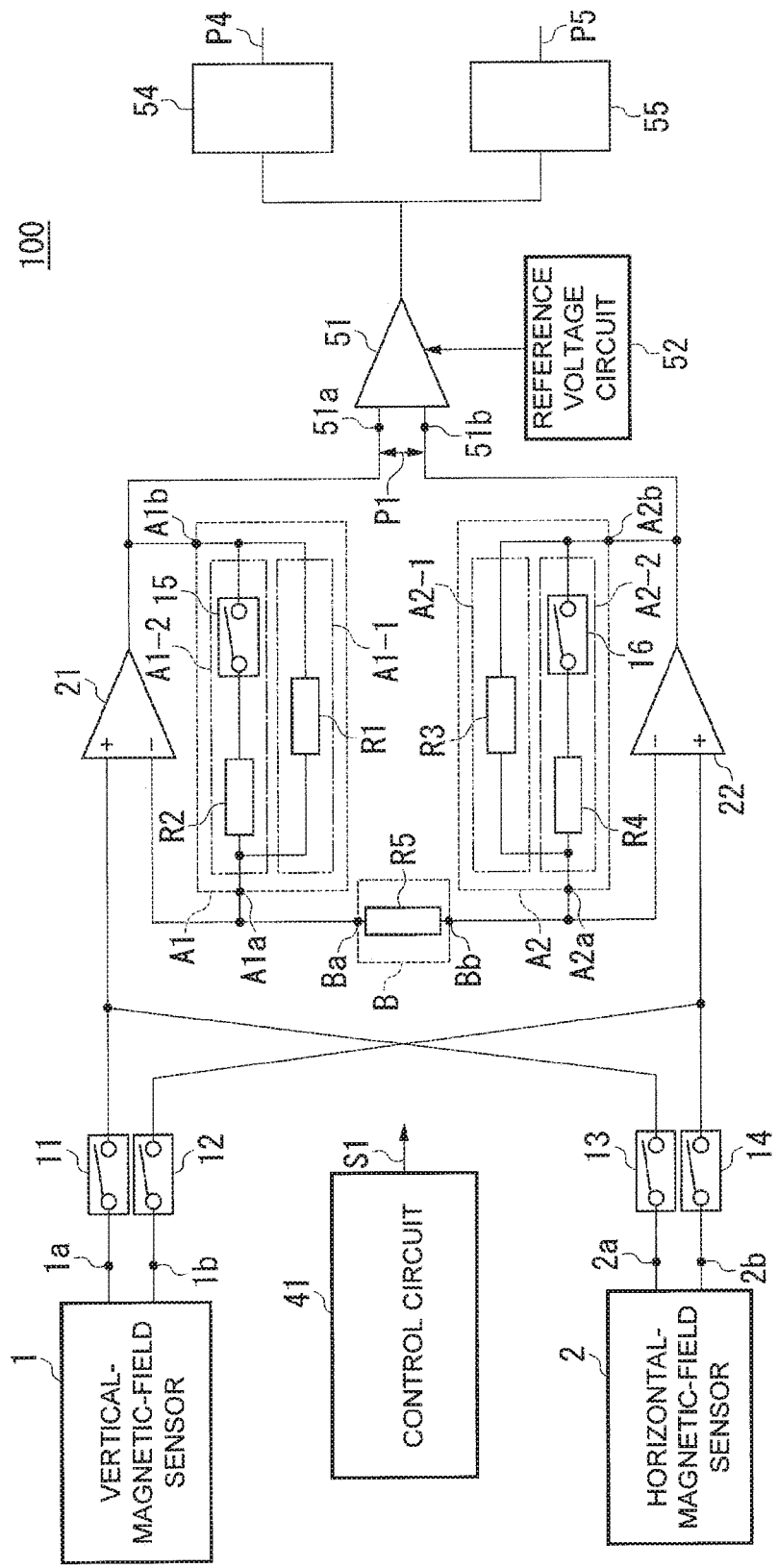
FIG. 2 is a diagram illustrating a magnetic sensor circuit according to the first embodiment.

FIG. 2 is a diagram illustrating a magnetic sensor circuit 100 according to the first embodiment.

The magnetic sensor circuit 100 includes the vertical-magnetic-field sensor 1, the horizontal-magnetic-field sensor 2, a switch 11, a switch 12, a switch 13, a switch 14, a first operational amplifier 21, a second operational amplifier 22, a control circuit 41, a comparator 51, a reference voltage circuit 52, a first latch circuit 54, a second latch circuit 55, a first feedback circuit A1, a second feedback circuit A2, and a resistor R5 as a connecting circuit B.

The vertical-magnetic-field sensor 1 includes a first terminal 1a and a second terminal 1b. The horizontal-magnetic-field sensor 2 includes a first terminal 2a and a second terminal 2b. The first feedback circuit A1 includes a first terminal A1a and a second terminal A1b. The second feedback circuit A2 includes a first terminal A2a and a second terminal A2b. The connecting circuit B includes a first terminal Ba and a second terminal Bb. The comparator 51 includes two input terminals (first terminal 51a and second terminal 51b) and an output terminal.

The first terminal 1a of the vertical-magnetic-field sensor 1 is connected to a non-inverting input terminal of the first operational amplifier 21 through the switch 11. The second terminal 1b of the vertical-magnetic-field sensor 1 is connected to a non-inverting input terminal of the second operational amplifier 22 though the switch 12. The first terminal 2a of the horizontal-magnetic-field sensor 2 is connected to a non-inverting input terminal of the first operational amplifier 21 through the switch 13. The second terminal 2b of the horizontal-magnetic-field sensor 2 is connected to a non-inverting input terminal of the second operational amplifier 22 through the switch 14.

The first terminal A1a of the first feedback circuit A1 and the first terminal Ba of the connecting circuit B are connected to an inverting input terminal of the first operational amplifier 21. The second terminal A1b of the first feedback circuit A1 and an output terminal of the first operational amplifier 21 are connected to the first terminal 51*a* of the comparator 51.

The first terminal A2*a* of the second feedback circuit A2 and the second terminal Bb of the connecting circuit B are connected to an inverting input terminal of the second operational amplifier 22. The second terminal A2*b* of the second feedback circuit A2 and an output terminal of the second operational amplifier 22 are connected to the second terminal 51*b* of the comparator 51.

The output terminal of the comparator 51 is connected to the first latch circuit 54 and the second latch circuit 55.

The operation of the magnetic sensor circuit 100 is hereinafter described.

The control circuit 41 outputs a control signal S1 to the switches 11 through 14 to control opening/closing thereof. The switches 11 through 14 are made open or closed according to the control signal S1 output by the control circuit 41 to switch the connections of the first operational amplifier 21 and the second operational amplifier 22 to the vertical-magnetic-field sensor 1 or the horizontal-magnetic-field sensor 2. Under the connection of the vertical-magnetic-field sensor 1 to the first operational amplifier 21 and the second operational amplifier 22, the magnetic sensor circuit 100 detects a vertical magnetic field, whereas under the connection of the horizontal-magnetic-field sensor 2 thereto, the magnetic sensor circuit 100 detects a horizontal magnetic field. Thus, the magnetic sensor circuit 100 detects two-axial magnetic fields (vertical and horizontal in this example).

The vertical-magnetic-field sensor 1 outputs a differential voltage corresponding to the magnitude of the detected vertical magnetic field from the first terminal 1*a* and the second terminal 1*b*. And the horizontal-magnetic-field sensor 2 outputs a differential voltage corresponding to the magnitude of the detected horizontal magnetic field from the first terminal 2*a* and the second terminal 2*b*.

In the detection of the vertical magnetic field by connecting the vertical-magnetic-field sensor 1 to the first operational amplifier 21 and the second operational amplifier 22, the control circuit 41 controls the switches 11 and 12 to be in a closed state and controls the switches 13 and 14 to be in an open state. Thus, only the vertical-magnetic-field sensor 1 is connected to the first operational amplifier 21 and the second operational amplifier 22. In the subsequent description, a mode in which only the vertical-magnetic-field sensor 1 is connected to the first operational amplifier 21 and the second operational amplifier 22 for measuring the vertical magnetic field is described as a first measurement mode.

Further, in the detection of the horizontal magnetic field by connecting the horizontal-magnetic-field sensor 2 to the first operational amplifier 21 and the second operational amplifier 22, the control circuit 41 controls the switches 13 and 14 to be in a closed state and controls the switches 11 and 12 to be in an open state. Thus, only the horizontal-magnetic-field sensor 2 is connected to the first operational amplifier 21 and the second operational amplifier 22. In the subsequent description, a mode in which only the horizontal-magnetic-field sensor 2 is connected to the first operational amplifier 21 and the second operational amplifier 22 for measuring the horizontal magnetic field is described as a second measurement mode.

The control circuit 41 switches the open/closed state of the switches 11 through 14 between the first measurement mode and the second measurement mode at every predetermined time. The predetermined time is a time interval in which the vertical-magnetic-field sensor 1 and the horizontal-magnetic-field sensor 2 can detect a change in the magnetic field accompanying the rotation of the ring-shaped multipolar magnet 500. More specifically, the control circuit 41 switches the first measurement mode and the second measurement mode according to the speed sufficiently faster than the rotating speed of the ring-shaped multipolar magnet 500.

The comparator 51 compares a differential voltage provided from the first operational amplifier 21 and the second operational amplifier 22 in the first or second measurement mode with a reference signal (voltage) provided from the reference voltage circuit 52.

For example, in a case where the differential voltage is larger than the reference signal as a result of comparison between the differential voltage and the reference signal by the comparator 51 in the first measurement mode, the magnetic field detected by the vertical-magnetic-field sensor 1 indicates a vertical magnetic field in a positive direction of the Z axis (magnetic field by S pole). Further, in a case where the differential voltage is smaller than the reference signal as the result of comparison therebetween by the comparator 51 in the first measurement mode, the magnetic field detected by the vertical-magnetic-field sensor 1 indicates a vertical magnetic field in a negative direction of the Z axis (magnetic field by N pole). For example, in a case where the differential voltage is larger than the reference signal as a result of comparison between the differential voltage and the reference signal by the comparator 51 in the second measurement mode, the magnetic field detected by the horizontal-magnetic-field sensor 2 indicates a horizontal magnetic field in a positive direction of the X axis (magnetic field by coming N pole). Further, in case where the differential voltage is smaller than the reference signal as the result of comparison therebetween by the comparator 51 in the second measurement mode, the magnetic field detected by the horizontal-magnetic-field sensor 2 indicates a horizontal magnetic field in a negative direction of the X axis (magnetic field by coming S pole).

In a case where the magnetic field detected by the vertical-magnetic-field sensor 1 is the magnetic field by N pole, the comparator 51 outputs a signal of a low level. In a case where the magnetic field detected by the vertical-magnetic-field sensor 1 is the magnetic field by S pole, the comparator 51 outputs a signal of a high level. In a case where the magnetic field detected by the horizontal-magnetic-field sensor 2 is the magnetic field by coming N pole, the comparator 51 outputs a signal of a low level. In a case where the magnetic field detected by the horizontal-magnetic-field sensor 2 is the magnetic field by coming S pole, the comparator 51 outputs a signal of a high level.

The first latch circuit 54 latches the signal output from the comparator 51 in the first measurement mode, and the second latch circuit 55 latches the signal output from the comparator 51 in the second measurement mode.

Explanation is made for change of an amplification factor of a signal output from the vertical-magnetic-field sensor 1 and of an amplification factor of a signal output from the horizontal-magnetic-field sensor 2 caused by switching of serially connected connecting paths for a feedback circuit (first feedback circuit A1) configuring a feedback loop of the first operational amplifier 21 and a feedback circuit (second feedback circuit A2) configuring a feedback loop of the second operational amplifier 22 by the control circuit 41.

The first feedback circuit A1 includes a first path A1-1 and a second path A1-2 connected in parallel with each other between the inverting input terminal of the first operational amplifier 21 and the output terminal thereof. Further, the second feedback circuit A2 includes a first path A2-1 and a second path A2-2 connected in parallel with each other between the inverting input terminal of the second operational amplifier 22 and the output terminal thereof.

The first path A1-1 includes a resistor R1. The second path A1-2 includes a resistor R2 and a switch 15. The resistor R1 is connected between the first terminal A1a and the second terminal A1b. Further, one end of the switch 15 is connected to the second terminal A1b, and the other end thereof is connected to the first terminal A1a through the resistor R2.

The first path A2-1 includes a resistor R3. The second path A2-2 includes a resistor R4 and a switch 16. The resistor R3 is connected between the first terminal A2a and the second terminal A2b. Further, one end of the switch 16 is connected to the second terminal A2b, and the other end thereof is connected to the first terminal A2a through the resistor R4.

The control circuit 41 controls the switches 15 and 16 to be in a closed state in the first measurement mode. In this case, the resistor R1 and the resistor R2 are connected in parallel with each other between the inverting input terminal of the first operational amplifier 21 and the output terminal thereof. The resistor R3 and the resistor R4 are connected in parallel with each other between the inverting input terminal of the second operational amplifier 22 and the output terminal thereof. Thus, an amplification factor of the first operational amplifier 21 is determined by the combined resistor of the resistors R1 and R2 and the resistor R5. An amplification factor of the second operational amplifier 22 is determined by the combined resistor of the resistors R3 and R4 and the resistor R5.

Further, the control circuit 41 controls the switches 15 and 16 to be in an open state in the second measurement mode. In this case, only the resistor R1 is connected between the inverting input terminal of the first operational amplifier 21 and the output terminal thereof. Also, only the resistor R3 is connected between the inverting input terminal of the second operational amplifier 22 and the output terminal thereof. Thus, the amplification factor of the first operational amplifier 21 is determined by the resistor R1 and the resistor R5. The amplification factor of the second operational amplifier 22 is determined by the resistor R3 and the resistor R5.

Here, the resistors R1, R2, and R5 have resistances at which the amplification factor of the first operational amplifier 21 becomes suitable for the amplification of the signal output from the vertical-magnetic-field sensor 1 in the first measurement mode. The resistors R3, R4, and R5 have resistances at which the amplification factor of the second operational amplifier 22 becomes suitable for the amplification of the signal output from the vertical-magnetic-field sensor 1 in the first measurement mode.

Further, the resistors R1 and R5 have resistances at which the amplification factor of the first operational amplifier 21 becomes suitable for the amplification of the signal output from the horizontal-magnetic-field sensor 2 in the second measurement mode. The resistors R3 and R5 have resistances at which the amplification factor of the second operational amplifier 22 becomes suitable for the amplification of the signal output from the horizontal-magnetic-field sensor 2.

With the above-described configuration, the amplification factors of the first operational amplifier 21 and the second operational amplifier 22 become low in the first measurement mode rather than the second measurement mode. Thus, the amplification factor of the signal output from the vertical-magnetic-field sensor 1 can be made lower than the amplification factor of the signal output from the horizontal-magnetic-field sensor 2.

As described above, according to the magnetic sensor circuit 100 of the present embodiment, the open/closed state of the switch 15 is switched to thereby make it possible to bring the impedance of the first feedback circuit A1 to the value of the combined resistor of the resistors R1 and R2 in the first measurement mode and to bring the impedance of the first feedback circuit A1 to the resistance of the resistor R1 in the second measurement mode. Further, according to the magnetic sensor circuit 100 of the present embodiment, the open/closed state of the switch 16 is switched to thereby make it possible to bring the impedance of the second feedback circuit A2 to the value of the combined resistor of the resistors R3 and R4 in the first measurement mode and to bring the impedance of the second feedback circuit A2 to the resistance of the resistor R3 in the second measurement mode.

Thus, according to the magnetic sensor circuit 100 of the present embodiment, the amplification factors of the first operational amplifier 21 and the second operational amplifier 22 can be switched synchronous to the switching of the measurement mode.

Further, in the magnetic sensor circuit 100 of the present embodiment, the switch 15 and the inverting input terminal of the first operational amplifier 21 are connected through the resistor R2. The switch 16 and the inverting input terminal of the second operational amplifier 22 are connected through the resistor R4. Thus, the magnetic sensor circuit 100 of the present embodiment is capable of suppressing direct input of noise generated with the opening/closing of the switches 15 and 16 into the first operational amplifier 21 and the second operational amplifier 22.

Second Embodiment

Figure 3:
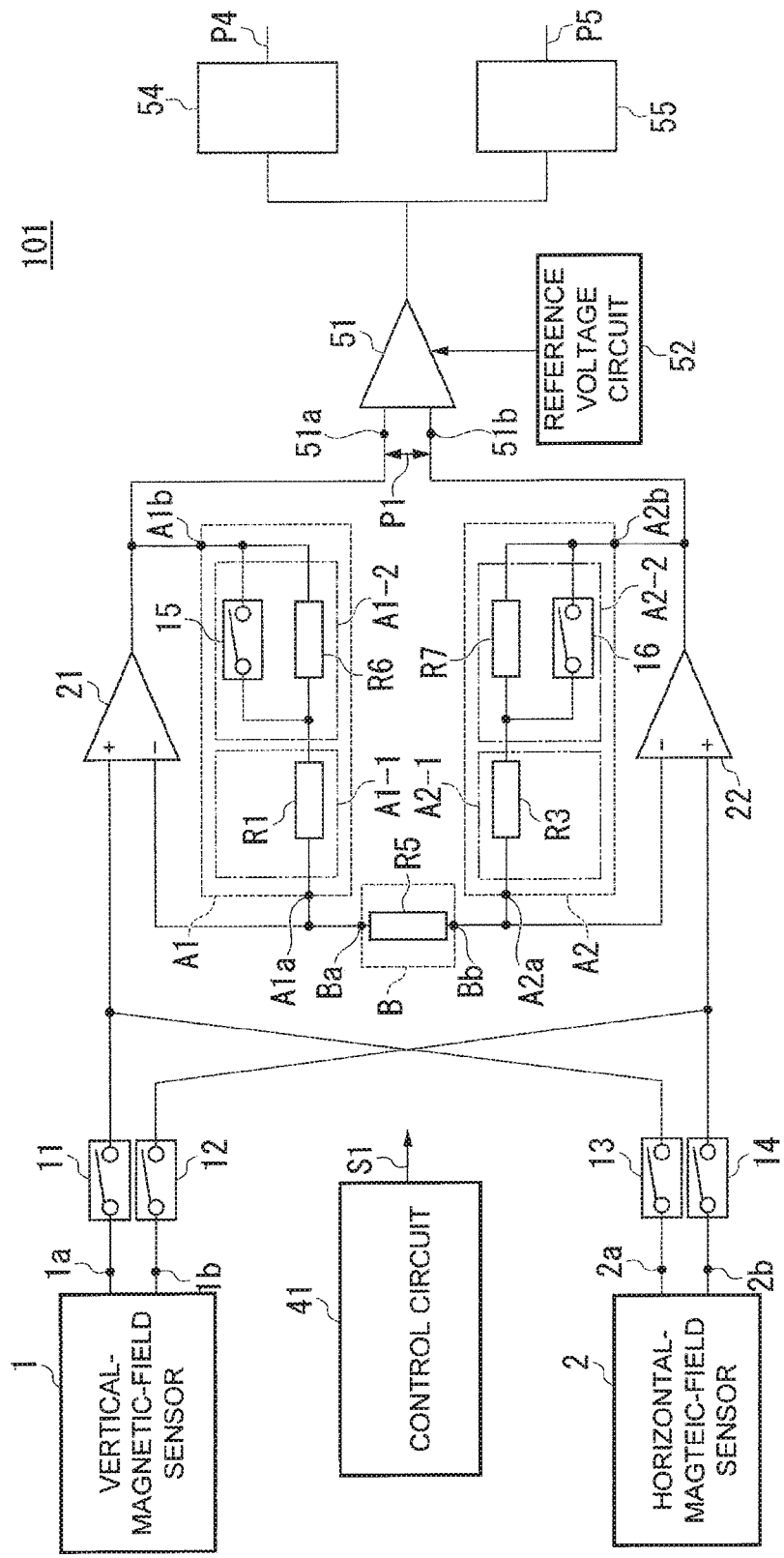
FIG. 3 is a diagram illustrating a magnetic sensor circuit according to the second embodiment.

FIG. 3 is a diagram illustrating an example of a magnetic sensor circuit 101 according to the second embodiment.

In the second embodiment explanation is made for change of an amplification factor of a signal output from a vertical-magnetic-field sensor 1 and an amplification factor of a signal output from a horizontal-magnetic-field sensor 2 caused by switching of serially connected connecting paths in the feedback circuits by the control circuit 41. Incidentally, components similar to those in the above-described embodiment are respectively denoted by the same reference numerals, and their description will therefore be omitted.

In the present embodiment, the first path A1-1 and the second path A1-2 are connected in series between the inverting input terminal of the first operational amplifier 21 and the output terminal thereof. Further, the first path A2-1 and the second path A2-2 are connected in series between the inverting input terminal of the second operational amplifier 22 and the output terminal thereof.

The first path A1-1 includes a resistor R1. The second path A1-2 includes a resistor R6 and a switch 15. One end of the resistor R1 is connected to the first terminal A1a, and the other end thereof is connected to the second path A1-2. The resistor R6 and the switch 15 are connected in parallel with each other between one end of the resistor R1 and the second terminal A1b.

Also, the first path A2-1 includes a resistor R3. The second path A2-2 includes a resistor R7 and a switch 16. One end of the resistor R3 is connected to the first terminal A2a, and the other end thereof is connected to the second path A2-2. The resistor R7 and the switch 16 are connected in parallel with each other between one end of the resistor R3 and the second terminal A2b.

The control circuit 41 controls the switches 15 and 16 to be in a closed state in a first measurement mode. In this case, only the resistor R1 is connected between the inverting input terminal of the first operational amplifier 21 and the output terminal thereof. Further, only the resistor R3 is connected between the inverting input terminal of the second operational amplifier 22 and the output terminal thereof. Thus, an amplification factor of the first operational amplifier 21 is determined by the resistors R1 and R5. An amplification factor of the second operational amplifier 22 is determined by the resistors R3 and R5.

Further, in a second measurement mode, the control circuit 41 controls the switches 15 and 16 to be in an open state. In this case, the resistors R1 and R6 are connected in series between the inverting input terminal of the first operational amplifier 21 and the output terminal thereof. The resistors R3 and R7 are connected in series between the inverting input terminal of the second operational amplifier 22 and the output terminal thereof. Thus, the amplification factor of the first operational amplifier 21 is determined by the combined resistor of the resistors R1 and R6 and the resistor R5. The amplification factor of the second operational amplifier 22 is determined by the combined resistor of the resistors R3 and R7 and the resistor R5.

Here, the resistors R1 and R5 have resistances at which the amplification factor of the first operational amplifier 21 becomes suitable for the amplification of the signal output from the vertical-magnetic-field sensor 1 in the first measurement mode. The resistors R3 and R5 have resistances at which the amplification factor of the second operational amplifier 22 becomes suitable for the amplification of the signal output from the vertical-magnetic-field sensor 1 in the first measurement mode.

Further, the resistors R1, R5, and R6 have resistances at which the amplification factor of the first operational amplifier 21 becomes suitable for the amplification of the signal output from the horizontal-magnetic-field sensor 2 in the second measurement mode. The resistors R3, R5, and R7 have resistances at which the amplification factor of the second operational amplifier 22 becomes suitable for the amplification of the signal output from the horizontal-magnetic-field sensor 2 in the second measurement mode.

With the above-described configuration, the amplification factors of the first operational amplifier 21 and the second operational amplifier 22 become low in the first measurement mode rather than the second measurement mode. Thus, the amplification factor of the signal output from the vertical-magnetic-field sensor 1 can be made lower than the amplification factor of the signal output from the horizontal-magnetic-field sensor 2.

As described above, according to the magnetic sensor circuit 101 of the present embodiment, the open/closed state of the switch 15 is switched to thereby make it possible to bring the impedance of the first feedback circuit A1 to the value of the resistor R1 in the first measurement mode and to bring the impedance of the first feedback circuit A1 to the value of the combined resistor of the resistors R1 and R6 in the second measurement mode. Further, according to the magnetic sensor circuit 101 of the present embodiment, the open/closed state of the switch 16 is switched to thereby make it possible to bring the impedance of the second feedback circuit A2 to the value of the resistor R3 in the first measurement mode and to bring the impedance of the second feedback circuit A2 to the value of the combined resistor of the resistors R3 and R7 in the second measurement mode.

Thus, according to the magnetic sensor circuit 101 of the present embodiment, the amplification factors of the first operational amplifier 21 and the second operational amplifier 22 can be switched synchronous to the switching of the measurement mode.

Further, in the magnetic sensor circuit 101 of the present embodiment, the switch 15 and the inverting input terminal of the first operational amplifier 21 are connected through the resistor R1. The switch 16 and the inverting input terminal of the second operational amplifier 22 are connected through the resistor R3. Thus, the magnetic sensor circuit 101 of the present embodiment is capable of suppressing direct input of noise generated with the opening/closing of the switches 15 and 16 into the first operational amplifier 21 and the second operational amplifier 22.

Third Embodiment

Figure 4:
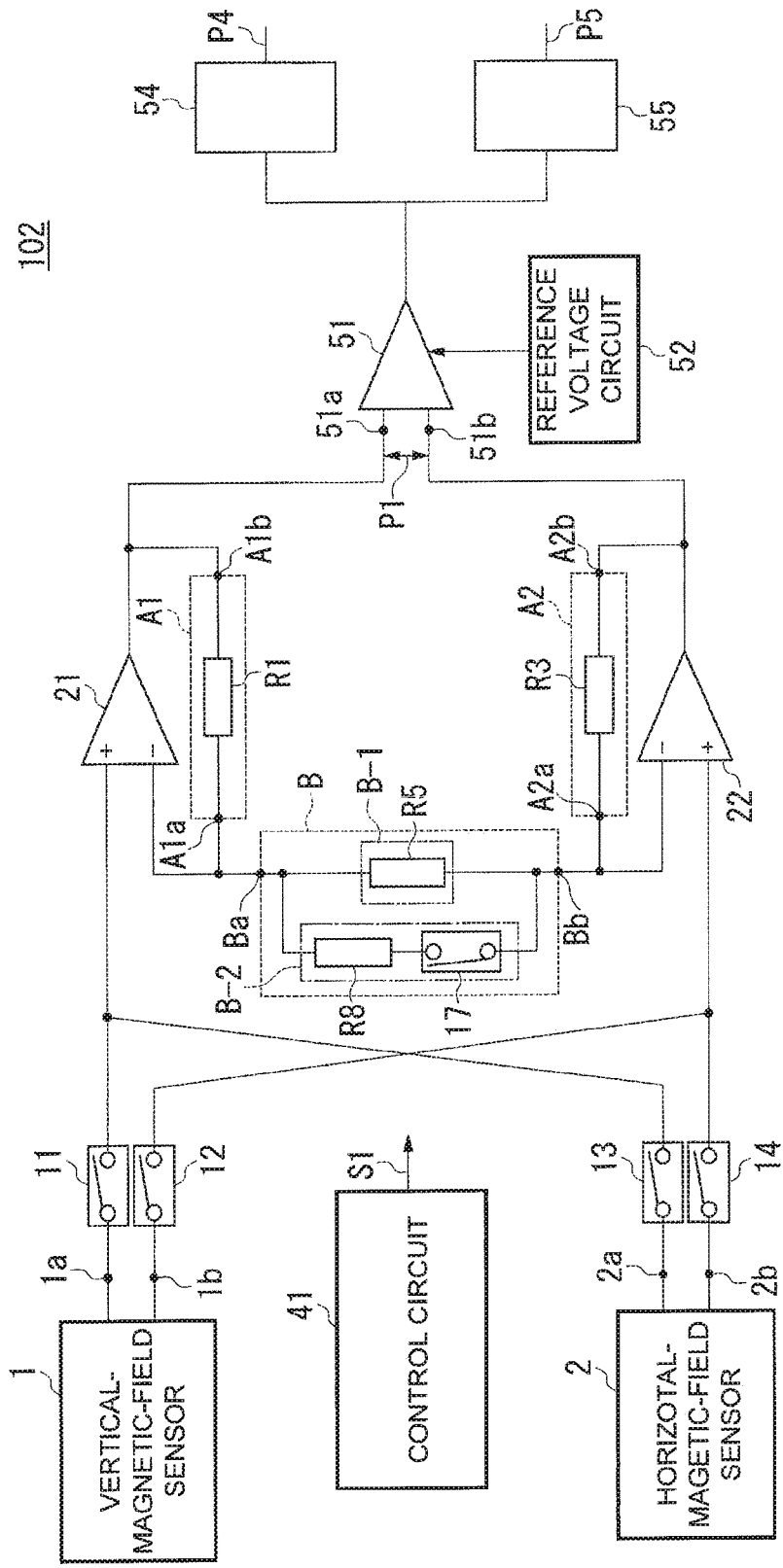
FIG. 4 is a diagram illustrating a magnetic sensor circuit according to the third embodiment.

FIG. 4 is a diagram illustrating a magnetic sensor circuit 102 according to the third embodiment.

In the third embodiment description is made for change of the amplification factors caused by switching of the serially connected connecting paths of the connecting circuit B by the control circuit 41. Incidentally, components similar to those in the above-described embodiment are respectively denoted by the same reference numerals, and their description will therefore be omitted.

In the present embodiment, the connecting circuit B includes a first path B-1 and a second path B-2 connected in parallel with each other between an inverting input terminal of a first operational amplifier 21, and an inverting input terminal of a second operational amplifier 22. A first feedback circuit A1 includes a resistor R1, and a second feedback circuit A2 includes a resistor R3.

The first path B-1 includes a resistor R5. The second path B-2 includes a resistor R8 and a switch 17. The resistor R5 is connected between a first terminal Ba and a second terminal Bb. Further, one end of the switch 17 is connected to the second terminal Bb, and the other end thereof is connected to the first terminal Ba through a resistor R8.

The control circuit 41 controls the switch 17 to be an open state in a first measurement mode. In this case, only the resistor R5 is connected between the inverting input terminal of the first operational amplifier 21 and the inverting input terminal of the second operational amplifier 22. Thus, an amplification factor of the first operational amplifier 21 is determined by the resistors R1 and R5. An amplification factor of the second operational amplifier 22 is determined by the resistors R3 and R5.

Further, the control circuit 41 controls the switch 17 to be a closed state in a second measurement mode. In this case, the resistors R5 and R8 are connected in parallel with each other between the inverting input terminal of the first operational amplifier 21 and the inverting input terminal of the second operational amplifier 22. Thus, the amplification factor of the first operational amplifier 21 is determined by the combined resistor of the resistors R5 and R8 and the resistor R1. The amplification factor of the second operational amplifier 22 is determined by the combined resistor of the resistors R5 and R8 and the resistor R3.

Here, the resistors R1 and R5 have resistances at which the amplification factor of the first operational amplifier 21 becomes suitable for the amplification of the signal output from the vertical-magnetic-field sensor 1 in the first measurement mode. The resistors R3 and R5 have resistances at which the amplification factor of the second operational amplifier 22 becomes suitable for the amplification of the signal output from the vertical-magnetic-field sensor 1 in the first measurement mode.

Further, the resistors R1, R5, and R8 have resistances at which the amplification factor of the first operational amplifier 21 becomes suitable for the amplification of the signal output from the horizontal-magnetic-field sensor 2 in the second measurement mode. The resistors R3, R5, and R8 have resistances at which the amplification factor of the second operational amplifier 22 becomes suitable for the amplification of the signal output from the horizontal-magnetic-field sensor 2 in the second measurement mode.

With the above-described configuration, the amplification factors of the first operational amplifier 21 and the second operational amplifier 22 become low in the first measurement mode rather than the second measurement mode. Thus, the amplification factor of the signal output from the vertical-magnetic-field sensor 1 can be made lower than the amplification factor of the signal output from the horizontal-magnetic-field sensor 2.

The connecting circuit B of the magnetic sensor circuit 102 of the present embodiment includes the first path B-1 and the second path B-2 connected in parallel with each other between the inverting input terminal of the first operational amplifier 21 and the inverting input terminal of the second operational amplifier 22 and different in impedance from each other. The first path B-1 includes the resistor R5. The second path B-2 includes the resistor R8 and the switch 17. The resistor R8 and the switch 17 are connected in series.

According to the magnetic sensor circuit 102 of the present embodiment, since the open/closed state of the switch 17 is switched to thereby make it possible to bring the impedance of the connecting circuit B to the value of the resistor R5 in the first measurement mode and to bring the impedance of the connecting circuit B to the value of the combined resistor of the resistors R5 and R8 in the second measurement mode, the amplification factors of the first operational amplifier 21 and the second operational amplifier 22 can be switched synchronous to the switching of the measurement mode.

Incidentally, the present invention is not limited to the present embodiment described above for the case where the other end of the switch 17 is connected to the first terminal Ba (inverting input terminal of first operational amplifier 21) through the resistor R8. One end of the switch 17 may be configured to be connected to the first terminal Ba, and the other end of the switch 17 may be configured to be connected to the second terminal Bb (inverting input terminal of second operational amplifier 22) through the resistor R8.

Fourth Embodiment

Figure 5:
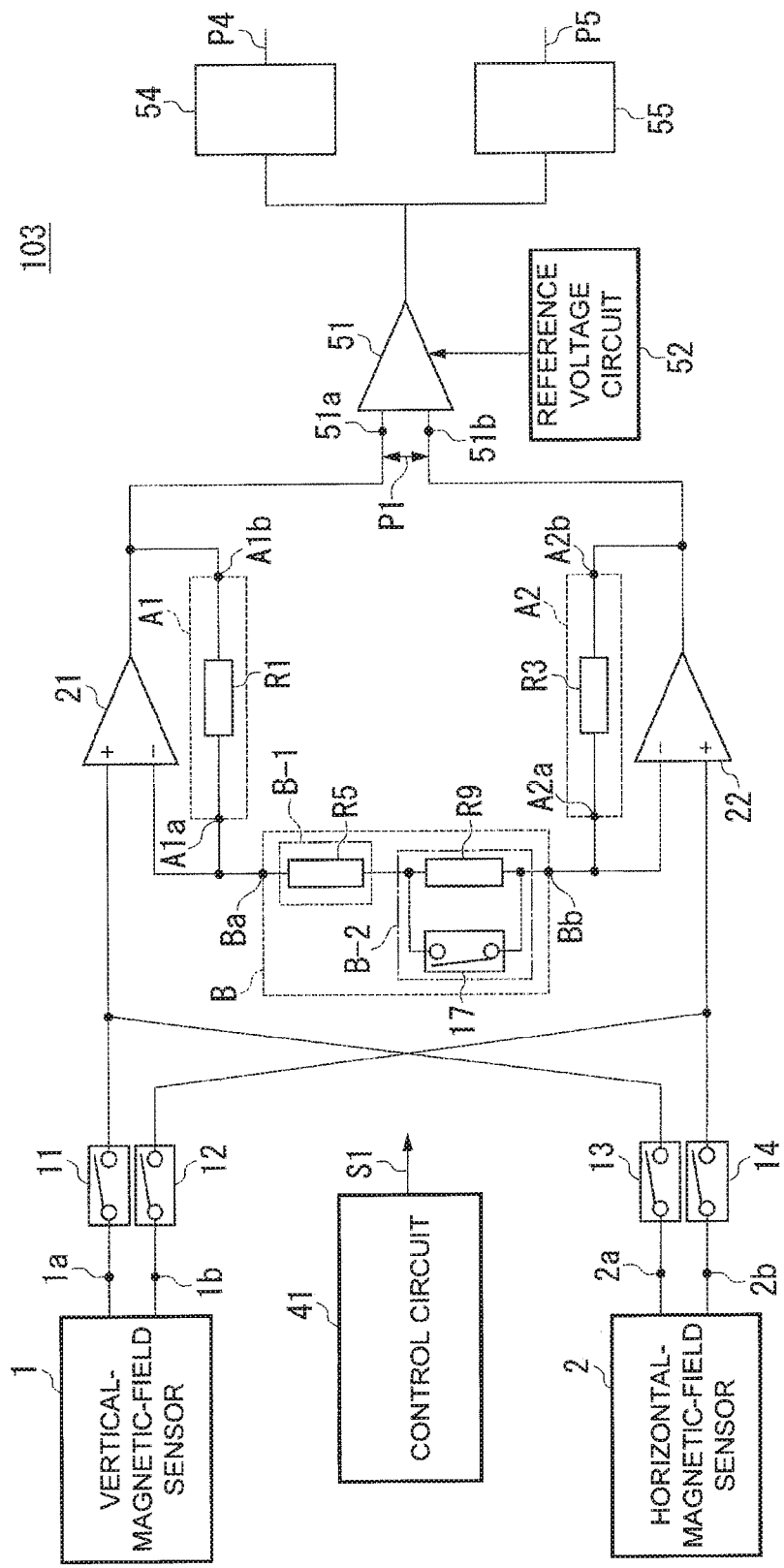
FIG. 5 is a diagram illustrating a magnetic sensor circuit according to the fourth embodiment.

FIG. 5 is a diagram illustrating one example of a magnetic sensor circuit 103 according to the fourth embodiment.

The fourth embodiment will describe a case where the serially connected connecting paths of the connecting circuit B are switched by a control circuit 41 to thereby change an amplification factor of a signal output from a vertical-magnetic-field sensor 1 and an amplification factor of a signal output from a horizontal-magnetic-field sensor 2. Incidentally, components similar to those in the above-described embodiment are respectively denoted by the same reference numerals, and their description will therefore be omitted.

In the present embodiment, a first path B-1 and a second path B-2 are connected in series between an inverting input terminal of a first operational amplifier 21 and an inverting input terminal of a second operational amplifier 22.

The first path B-1 includes a resistor R5. The second path B-2 includes a resistor R9 and a switch 17. One end of the resistor R5 is connected to a first terminal Ba, and the other end of the resistor R5 is connected to the second path B-2. The resistor R9 and the switch 17 are connected in parallel with each other between one end of the resistor R5 and a second terminal Bb.

Further, a first feedback circuit A1 includes a resistor R1, and a second feedback circuit A2 includes a resistor R3.

The control circuit 41 controls the switch 17 to be in an open state in a first measurement mode. In this case, the resistors R5 and R9 are connected in series between the inverting input terminal of the first operational amplifier 21 and the inverting input terminal of the second operational amplifier 22. Thus, an amplification factor of the first operational amplifier 21 is determined by the combined resistor of the resistors R5 and R9 and the resistor R1. An amplification factor of the second operational amplifier 22 is determined by the combined resistor of the resistors R5 and R9 and the resistor R3.

Further, the control circuit 41 controls the switch 17 to be in a closed state in a second measurement mode. In this case, only the resistor R5 is connected between the inverting input terminal of the first operational amplifier 21 and the inverting input terminal of the second operational amplifier 22. Thus, the amplification factor of the first operational amplifier 21 is determined by the resistors R1 and R5. The amplification factor of the second operational amplifier 22 is determined by the resistors R3 and R5.

Here, the resistors R1, R5, and R9 have resistances at which the amplification factor of the first operational amplifier 21 becomes suitable for the amplification of the signal output from the vertical-magnetic-field sensor 1 in the first measurement mode. The resistors R3, R5, and R9 have resistances at which the amplification factor of the second operational amplifier 22 becomes suitable for the amplification of the signal output from the vertical-magnetic-field sensor 1 in the first measurement mode.

Further, the resistors R1 and R5 have resistances at which the amplification factor of the first operational amplifier 21 becomes suitable for the amplification of the signal output from the horizontal-magnetic-field sensor 2 in the second measurement mode. The resistors R3 and R5 have resistances at which the amplification factor of the second operational amplifier 22 becomes suitable for the amplification of the signal output from the horizontal-magnetic-field sensor 2 in the second measurement mode.

With the above-described configuration, the amplification factors of the first operational amplifier 21 and the second operational amplifier 22 become low in the first measurement mode rather than the second measurement mode. Thus, the amplification factor of the signal output from the vertical-magnetic-field sensor 1 can be made lower than the amplification factor of the signal output from the horizontal-magnetic-field sensor 2.

As described above, according to the magnetic sensor circuit 103 of the present embodiment, the open/closed state of the switch 17 is switched to thereby make it possible to bring the impedance of the connecting circuit B to the value of the combined resistor of the resistors R5 and R9 in the first measurement mode and to bring the impedance of the connecting circuit B to the value of the resistor R5 in the second measurement mode.

Thus, according to the magnetic sensor circuit 103 of the present embodiment, the amplification factors of the first operational amplifier 21 and the second operational amplifier 22 can be switched synchronous to the switching of the measurement mode.

Incidentally, the present invention is not limited to the present embodiment described above for the case where the other end of the switch 17 is connected to the first terminal Ba (inverting input terminal of first operational amplifier 21) through the resistor R5. One end of the switch 17 may be configured to be connected to the first terminal Ba, and the other end of the switch 17 may be configured to be connected to the second terminal Bb (inverting input terminal of second operational amplifier 22) through the resistor R5.

[Modification 1]

With reference to the accompanying drawings a modification 1 according to the first and third embodiments of the present invention will hereinafter be described in which two resistors are connected to both ends of a switch within a second path. Incidentally, components similar to those in the above-described embodiments are respectively denoted by the same reference numerals, and their description will therefore be omitted.

FIG. 6 is a diagram illustrating an example of the second path according to the modification 1.

Figure 6A:
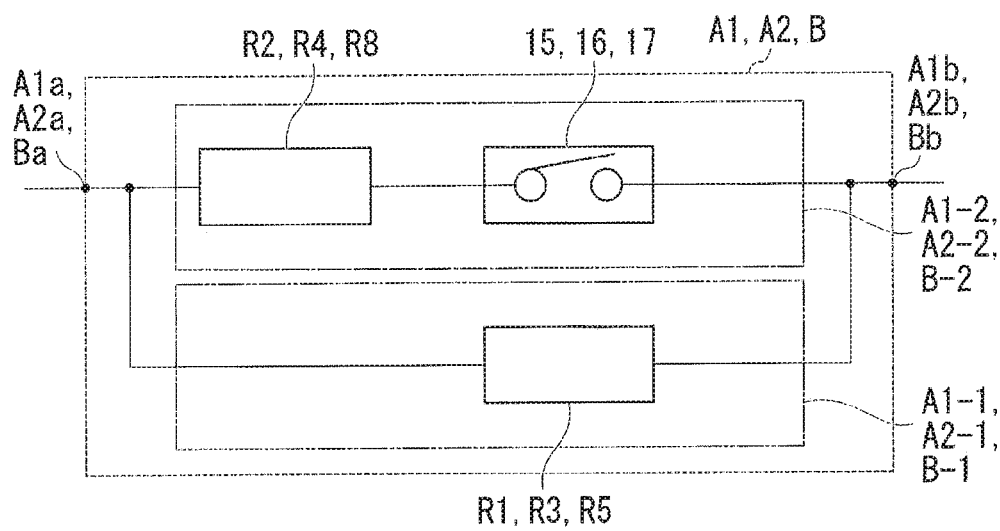
FIGS. 6A and 6B are diagrams illustrating examples of a second path according to a modification 1.

As illustrated in FIG. 6A, the above-described first and third embodiments respectively have described the case where the second path A1-2, the second path A2-2, and the second path B-2 are provided with the switch (switch 15, switch 16, and switch 17) and the resistor (resistor R2, resistor R4, and resistor R8) respectively one by one.

Figure 6B:
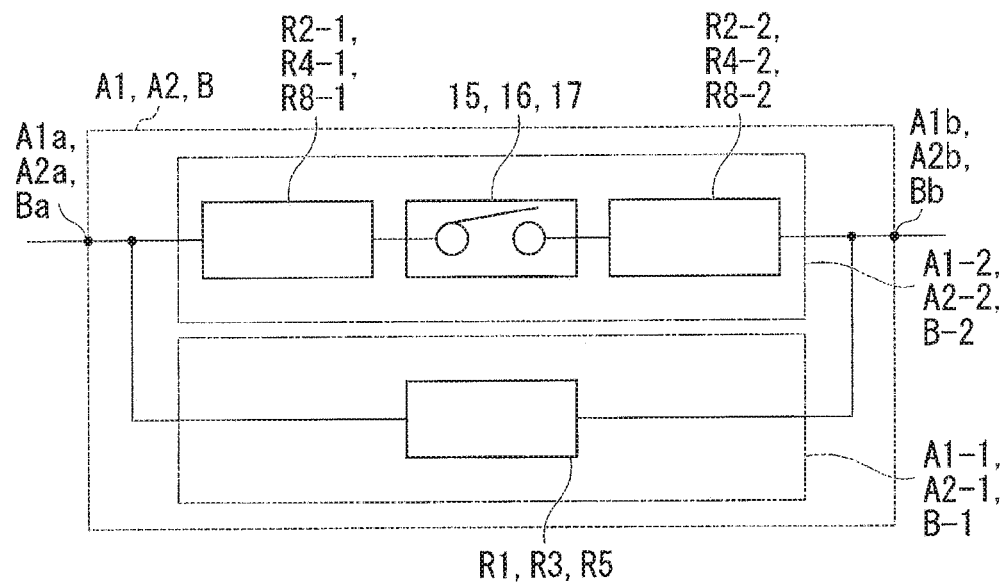

In the modification 1, as illustrated in FIG. 6B, a second path A1-2 is provided with a resistor R2-1 and a resistor R2-2 at both ends of a switch 15 respectively. Also, a second path A2-2 is provided with a resistor R4-1 and a resistor R4-2 at both ends of a switch 16 respectively. Further, a second path B-2 is provided with a resistor R8-1 and a resistor R8-2 at both ends of a switch 17 respectively.

Here, it is preferable that the switch 15 is controlled to be in a closed state to thereby make the resistance of the combined resistor of the resistors R2-1 and R2-2 connected in series coincide with the resistance of the resistor R2. Also, it is preferable that the switch 16 is controlled to be in a closed state to thereby make the resistance of the combined resistor of the resistors R4-1 and R4-2 connected in series coincide with the resistance of the resistor R4. Further, it is preferable that the switch 17 is controlled to be in a closed state to thereby make the resistance of the combined resistor of the resistors R8-1 and R8-2 connected in series coincide with the resistance of the resistor R8.

In the above-described first embodiment, for example, there is a case where noise generated with the opening/closing of the switches 15 and 16 is superposed on the output terminal of the first operational amplifier 21 and the output terminal of the second operational amplifier 22 and thereby affects the input of the next stage (comparator 51 in this example). According to the second path A1-2 and the second path A2-2 in the modification 1, direct input of the noise generated with the opening/closing of the switches 15 and 16 into the comparator 51 can be suppressed.

[Modification 2]

With reference to the accompanying drawings a modification 2 according to the second and fourth embodiments of the present invention will hereinafter be described in which two resistors are connected to both ends of a switch within a second path. Incidentally, components similar to those in the above-described embodiments are respectively denoted by the same reference numerals, and their description will therefore be omitted.

FIG. 7 is a diagram illustrating an example of a first path according to the modification 2.

Figure 7A:
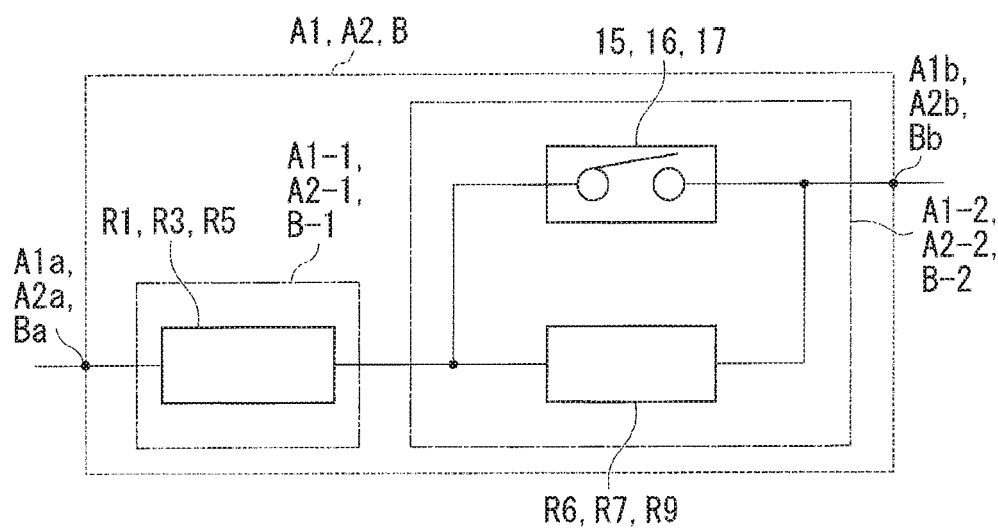
FIGS. 7A and 7B are diagrams illustrating examples of a first path according to a modification 2.

As illustrated in FIG. 7A, the above-described second and fourth embodiments respectively have described the case where the first path A1-1, the first path A2-1, and the first path B-1 are provided with the resistors (resistor R1, resistor R3, and resistor R5) respectively one by one.

Figure 7B:
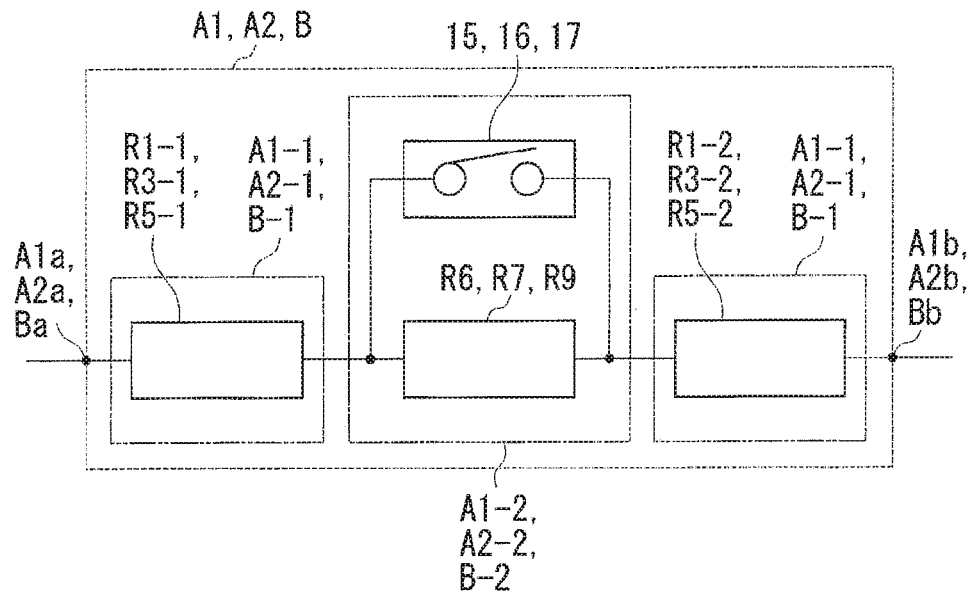

In the modification 2, as illustrated in FIG. 7B, a first feedback circuit A1 includes a resistor R1-1 and a resistor R1-2 on both ends of the second path A1-2 (switch 15) as first paths A1-1. A second feedback circuit A2 and a connecting circuit B have also the same structure as shown in the drawing.

Here, it is preferable that the switch 15 is controlled to be in a closed state to thereby make the resistance of the combined resistor of the resistors R1-1 and R1-2 connected in series with the second path A1-2 coincide with the resistance of the resistor R1. Also, it is preferable that the switch 16 is controlled to be in a closed state to thereby make the resistance of the combined resistor of the resistors R3-1 and R3-2 connected in series with the second path A2-2 coincide with the resistance of the resistor R3. Further, it is preferable that the switch 17 is controlled to be in a closed state to thereby make the resistance of the combined resistor of the resistors R5-1 and R5-2 connected in series with the second path B-2 coincide with the resistance of the resistor R5.

In the above-described second embodiment, for example, there is a case where noise generated with the opening/closing of the switches 15 and 16 is superposed on the output signal of the first operational amplifier 21 and the output signal of the second operational amplifier 22 and thereby affects the input of the next stage (comparator 51 in this example). According to the first path A1-1 and the first path A2-1 in the modification 2, direct input of the noise to the comparator 51 generated with the opening/closing of the switches 15 and 16 can be suppressed.

[Modification 3]

A modification 3 according to the first embodiment, the second embodiment, the third embodiment, the fourth embodiment, the modification 1, and the modification 2 will hereinafter be described with reference to the accompanying drawings in which only the first path or only the second path is connected in the first and the second measurement modes.

FIG. 8 is a diagram illustrating an example of the first and second paths according to the modification 3.

Figure 8A:
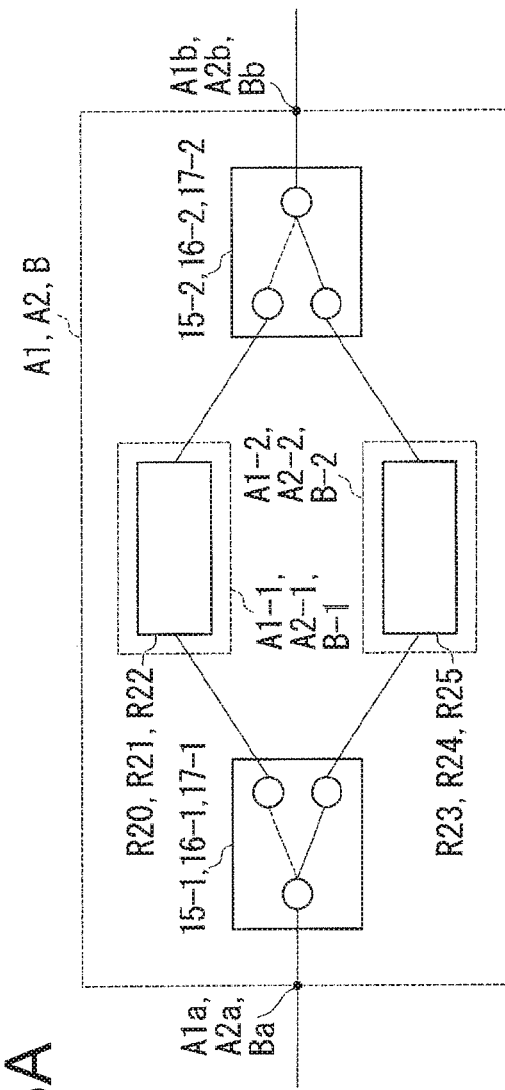
FIGS. 8A and 8B are diagrams illustrating examples of a first path and a second path according to a modification 3.

In the modification 3, as illustrated in FIG. 8A, a first feedback circuit A1 includes a switch 15 (switch 15-1 and switch 15-2 illustrated in the drawing), a first path A1-1, and a second path A1-2. The first path A1-1 includes a resistor R20. The second path A1-2 includes a resistor R23. A second feedback circuit A2 and a connecting circuit B have also the same structure as shown in the drawing.

In the modification 3, each of the switch 15, the switch 16, and the switch 17 switches a connection in each circuit to the first or second path. Specifically, the switch 15-1 and the switch 15-2 are interlocked to be open or closed with each other. Also, the switch 16-1 and the switch 16-2, and the switch 17-1 and the switch 17-2 are interlocked with each other.

In the first feedback circuit A1 the control circuit 41 controls the state of the switch 15 to connect the first path A1-1 between the first terminal A1$a$ and the second terminal A1$b$ in the first measurement mode. The control circuit 41 controls the state of the switch 15 to connect the second path A1-2 between the first terminal A1*a* and the second terminal A1*b* in the second measurement mode. Similar operations are carried out in the second feedback circuit and in the connecting circuit B.

Here, the resistor R20, the resistor R21, and the resistor R22 have resistances at which the amplification factor becomes suitable for an amplification of a signal output from a vertical-magnetic-field sensor 1. The resistor R23, the resistor R24, and the resistor R25 have resistances at which the amplification factor becomes suitable for an amplification of a signal output from a horizontal-magnetic-field sensor 2.

Thus, according to the first feedback circuit A1, the second feedback circuit A2, and the connecting circuit B in the modification 3, the amplification factor of the signal output from the vertical-magnetic-field sensor 1 can be made lower than the amplification factor of the signal output from the horizontal-magnetic-field sensor 2.

Figure 8B:
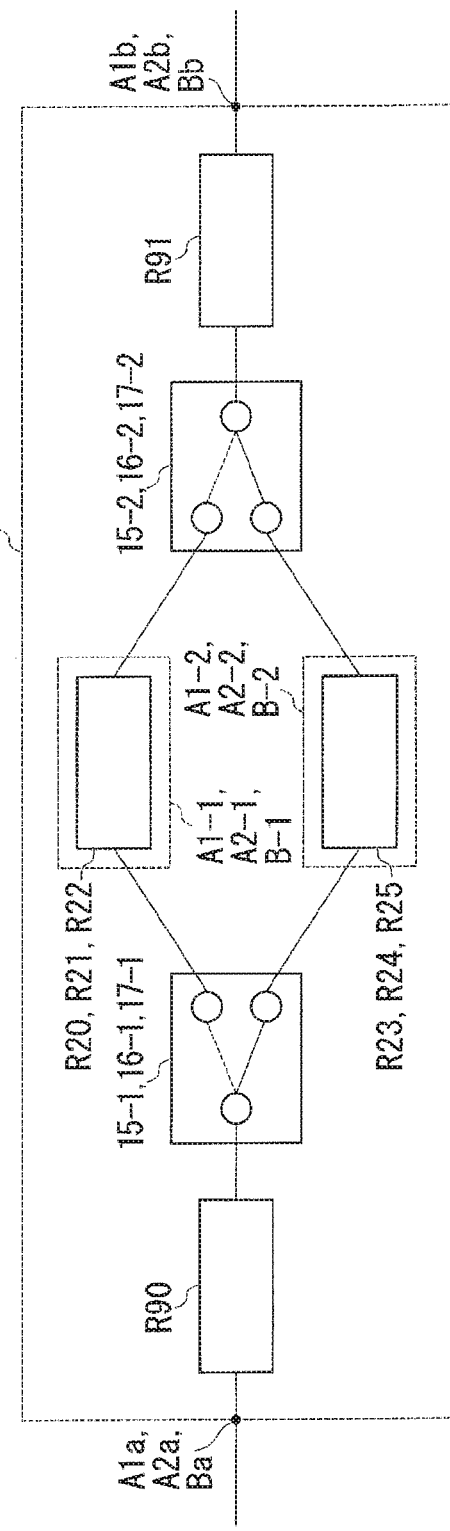

Incidentally, as illustrated in FIG. 8B, the first feedback circuit A1, the second feedback circuit A2, and the connecting circuit B in the modification 3 may respectively be configured to have resistors at both ends of the switches 15, 16, and 17. Specifically, they may be configured to have resistors R90 and R91 at both ends of the switches 15, 16, and 17 respectively.

In this case, the combined resistor of the resistors R90, R91, and R20, the combined resistor of the resistors R90, R91, and R21, and the combined resistor of the resistors R90, R91, and R22 have resistances at which an amplification factor becomes suitable for the amplification of the signal output from the vertical-magnetic-field sensor 1. Further, the combined resistor of the resistors R90, R91, and R23, the combined resistor of the resistors R90, R91, and R24, and the combined resistor of the resistors R90, R91, and R25 have resistances at which the amplification factor becomes suitable for the amplification of the signal output from the horizontal-magnetic-field sensor 2.

Thus, according to the first feedback circuit A1, the second feedback circuit A2, and the connecting circuit B in the modification 3, while switching the amplification factor of the signal output from the vertical-magnetic-field sensor 1 to the amplification factor of the signal output from the horizontal-magnetic-field sensor 2, direct input of noise to the first operational amplifier 21 and the second operational amplifier 22 and to the comparator 51 generated with the opening/closing of the switch 15, the switch 16, and the switch 17 can be suppressed.

Incidentally, the first feedback circuit A1, for example, may be configured to have one of the switches 15-1 and 15-2. In a case where the first feedback circuit A1 includes the switch 15-1, for example, one ends of the resistors (resistor R20 and resistor R23) connected to the switch 15-2 are connected to the second terminal A1*b*. Further, in a case where the first feedback circuit A1 includes the switch 15-2, for example, one ends of the resistors (resistor R20 and resistor R23) connected to the switch 15-1 are connected to the first terminal A1*a*. The second feedback circuit A2 and the connecting circuit B can have a similar structure to the first feedback circuit A1.

The details of the output signal of the vertical-magnetic-field sensor 1 and the output signal of the horizontal-magnetic-field sensor 2 at each of which the amplification factor is adjusted in the above-described embodiments and modifications, will hereinafter be described with reference to the accompanying drawings.

Figure 9A:
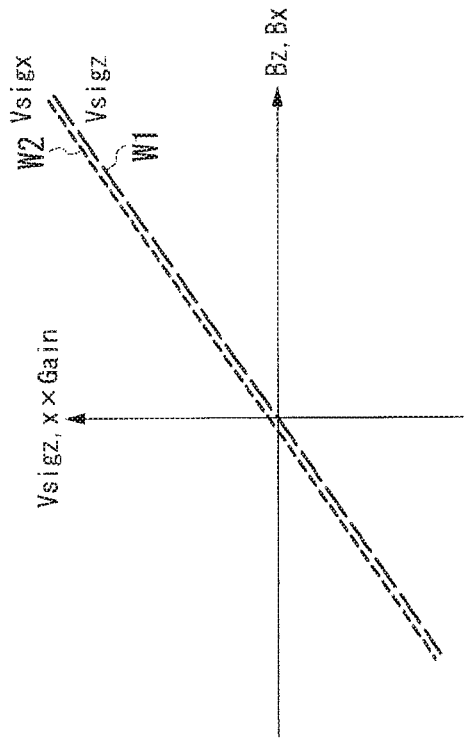
FIGS. 9A and 9B are graphs illustrating an output from the vertical-magnetic-field sensor and an output from the horizontal-magnetic-field sensor respectively.
Figure 9B:
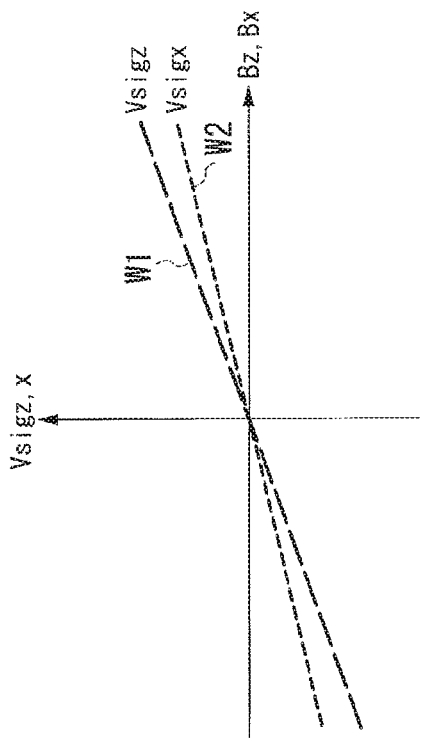

FIG. 9A and FIG. 9B are graphs illustrating the output signal W1 of the vertical-magnetic-field sensor 1 and the output signal W2 of the horizontal-magnetic-field sensor 2 against the vertical magnetic field and horizontal magnetic field of the same strength respectively. FIG. 9A shows the output signals before the adjustment of their amplification factors. FIG. 9B shows the output signals after the adjustment of their amplification factors.

The waveform W1 is a waveform illustrating a change in the voltage at a measurement point P1 (measurement point P1 illustrated in FIGS. 2 through 4) in the first measurement mode. The change in the voltage at the measurement point P1 illustrates a voltage value obtained by subtracting a voltage at the second terminal 51*b* from a voltage at the first terminal 51*a*. Further, the waveform W2 is a waveform illustrating a change in the voltage at the measurement point P1 in the second measurement mode.

As described above, the vertical-magnetic-field sensor 1 is higher than the horizontal-magnetic-field sensor 2 in detection sensitivity of a magnetic field. Thus, even in the detection of the vertical and horizontal magnetic fields of the same strength by the vertical-magnetic-field sensor 1 and the horizontal-magnetic-field sensor 2, the output of the vertical-magnetic-field sensor 1 becomes larger than that of the horizontal-magnetic-field sensor 2 (FIG. 9A, for example).

With this, the amplification factors of the output signal of the vertical-magnetic-field sensor 1 and the output signal of the horizontal-magnetic-field sensor 2 are adjusted according to the configurations of the above-described embodiments and modifications, thereby making it possible to have nearly the same detection sensitivities of the vertical-magnetic-field sensor 1 and the horizontal-magnetic-field sensor 2 (FIG. 9B, for example).

Figure 10:
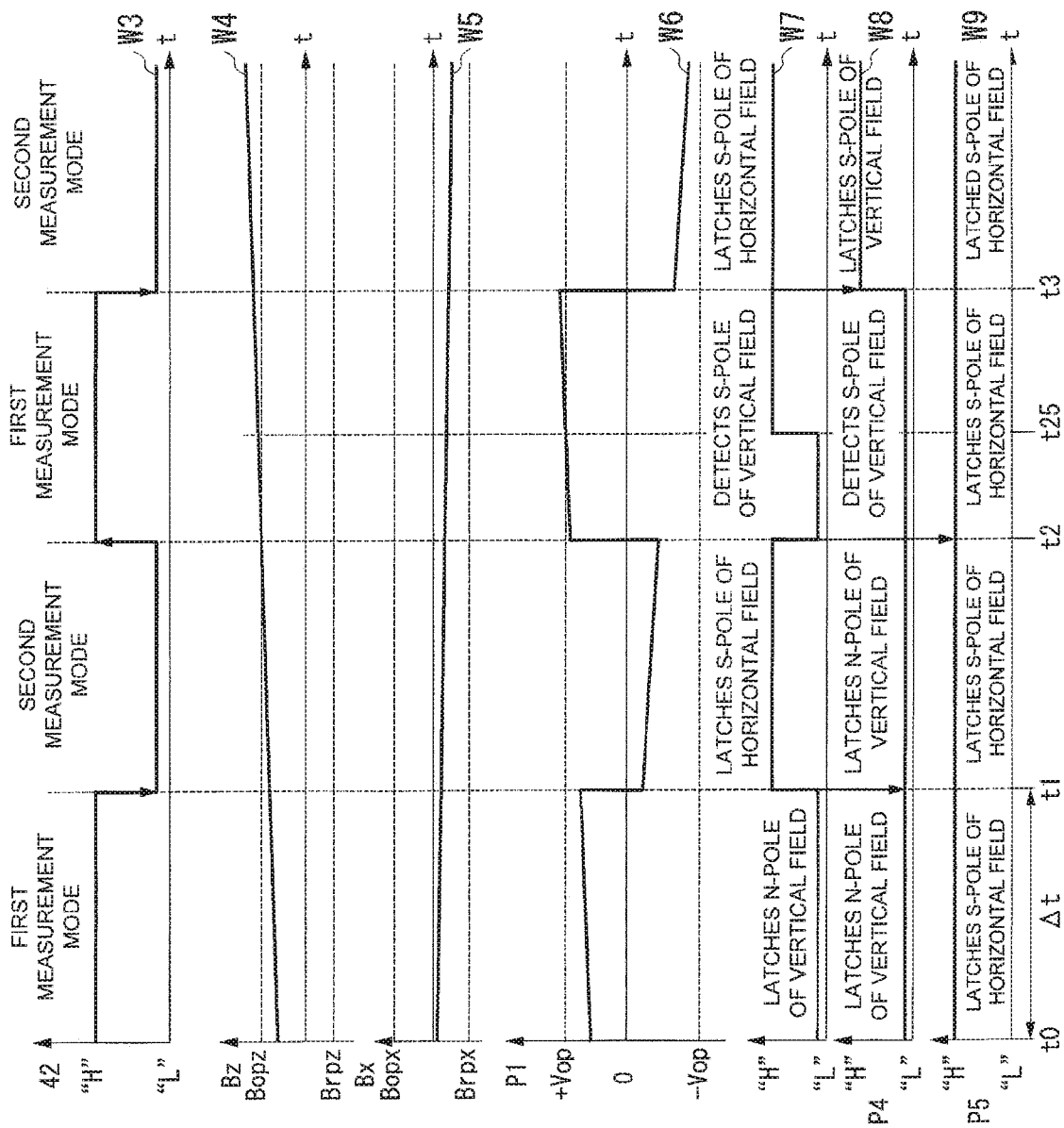
FIG. 10 is a timing chart illustrating an operation of a magnetic sensor circuit.

The operation of the magnetic sensor circuit along the transition between the first and second measurement modes will be described below with the use of FIG. 10.

The control circuit 41 controls the switches at every predetermined time $\Delta t$ and thereby switches the operation mode of the magnetic sensor circuit between the first measurement mode and the second measurement mode (waveform W3). A signal for a vertical magnetic field (waveform W4) and a signal for a horizontal magnetic field (waveform W5) are generated in the magnetic sensor circuit accompanying the rotation of the ring-shaped multipolar magnet 500.

In the first measurement mode, a differential voltage supplied from the vertical-magnetic-field sensor 1 according to the vertical magnetic field is provided to the input terminal (measurement point P1) of the comparator 51, and in the second measurement mode, a differential voltage supplied from the horizontal-magnetic-field sensor 2 according to the horizontal magnetic field is provided thereto (waveform W6). The comparator 51 outputs a signal indicative of the vertical magnetic field in the first measurement mode and outputs a signal indicative of the horizontal magnetic field in the second measurement mode (waveform W7).

The first latch circuit 54 latches and outputs a signal indicative of the direction of the vertical magnetic field, based on the signal supplied from the comparator 51 in the first measurement mode (waveform W8). Further, the second latch circuit 55 latches and outputs a signal indicative of the direction of the horizontal magnetic field, based on the signal supplied from the comparator 51 in the second measurement mode (waveform W9).

The magnetic sensor circuit operates in the first measurement mode and detects a vertical magnetic field in the time duration $\Delta t$ from time t0 to time t1. In this duration, the vertical-magnetic-field sensor 1 detects a vertical magnetic field by an N pole. The comparator 51 outputs a signal of a low level indicative of the N pole. The first latch circuit 54 latches a signal at the low level supplied from the comparator 51 at time t1 (waveform W8).

The magnetic sensor circuit operates in the second measurement mode and detects a horizontal magnetic field in the time duration Δt from time t1 to time t2. In this duration, the horizontal-magnetic-field sensor 2 detects a magnetic field by a coming S pole. The comparator 51 outputs a signal of a high level indicative of the S pole. The second latch circuit 55 latches a signal at the high level supplied from the comparator 51 at time t2 (waveform W9).

The magnetic sensor circuit operates in the first measurement mode and detects a vertical magnetic field in the time duration Δt from time t2 to time t3. Here, the voltage of the measurement point P1 exceeds a reference voltage (+Vop) at a certain time (t25). The comparator 51 outputs a signal of a high level indicative of the S pole. The first latch circuit 54 latches a signal at the high level at time t3 (waveform W8).

By repeatedly performing the above-described operations, the first latch circuit 54 outputs a detection result of the vertical magnetic field, and the second latch circuit 55 outputs a detection result of the horizontal magnetic field.

As described above, the magnetic sensor circuit of the present invention is capable of detecting 2-axial (vertical and horizontal) magnetic fields in nearly the same sensitivity without using the magnetic converging plate. Further, the magnetic sensor circuit of the present invention is capable of reducing an occupation area of an amplifier circuit by the common amplifier circuit (first operational amplifier 21, second operational amplifier 22, first feedback circuit A1, and second feedback circuit A2) in the first and second measurement modes.

Incidentally, although the above-described embodiments and modifications respectively have described the case where the first feedback circuit A1 of the first operational amplifier 21 and the second feedback circuit A2 of the second operational amplifier 22 are the same in circuit configuration, the present invention is not limited to it. The magnetic sensor circuit may be configured to have either the first feedback circuit A1 or the second feedback circuit A2, for example. In other words, the feedback circuit of the first operational amplifier 21 and the feedback circuit of the second operational amplifier 22 may respectively be an asymmetric circuit configuration.

Fifth Embodiment

Figure 11:
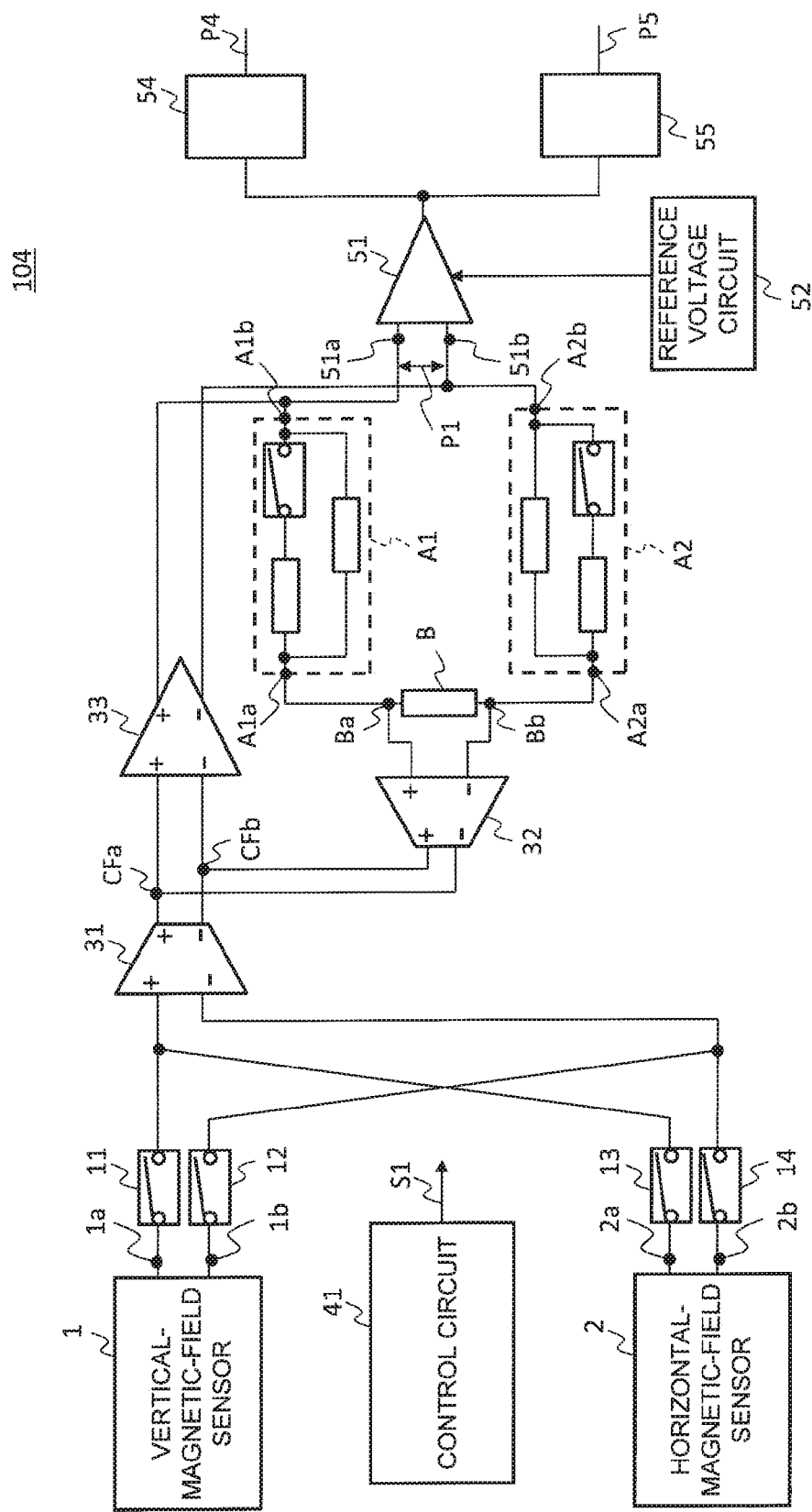
FIG. 11 is a diagram illustrating a magnetic field sensor according to the fifth embodiment.

FIG. 11 is a diagram showing a magnetic sensor circuit 104 according to the fifth embodiment of the present invention.

In the fifth embodiment an amplification circuit is configured from the first transconductance amplifier 31, the second transconductance amplifier 32 and a transimpedance amplifier 33 instead of the first amplifier 21 and the second amplifier 22. Incidentally, components similar to those in the above-described embodiments are respectively denoted by the same reference numerals, and their description will therefore be omitted.

The amplification circuit in the fifth embodiment uses a current feedback instrumentation amplifier although the amplification circuits in the first to the fourth embodiments use voltage feedback instrumentation amplifiers. That is, the amplification circuit in the fifth embodiment carries out, at the nodes CFa and CFb, an addition of a signal current generated in the first transconductance amplifier 31 and a feedback signal current obtained in the transconductance amplifier 32 by voltage-current conversion of the feedback signal voltage generated in the first feedback circuit A1, the second feedback circuit A2, and the connection circuit B.

The first terminal 1a of the vertical-magnetic-field sensor 1 is connected to the non-inverting input of the first transconductance amplifier 31 through the switch 11. The second terminal 1b of the vertical-magnetic-field sensor 1 is connected to the inverting input of the first transconductance amplifier 31 through the switch 12. The first terminal 2a of the horizontal-magnetic-field sensor 2 is connected to the non-inverting input of the first transconductance amplifier 31 through the switch 13. The second terminal 2b of the horizontal-magnetic-field sensor 2 is connected to the inverting input of the first transconductance amplifier 31 through the switch 14.

The first terminal A1a of the first feedback circuit A1 and the first terminal Ba of the connection circuit B are connected to the non-inverting input terminal of the second transconductance amplifier 32. The second terminal A1b of the first feedback circuit A1 and the non-inverting output terminal of the transimpedance amplifier 33 are connected to the first terminal of the comparator 51a.

The first terminal A2a of the second feedback circuit A2 and the second terminal Bb of the connection circuit B are connected to the inverting input terminal of the second transconductance amplifier 32. The second terminal A2b of the second feedback circuit A2 and the inverting output terminal of the transimpedance amplifier 33 are connected to the second terminal of the comparator 51b.

By the configuration explained above the amplification factor of the current feedback instrumentation amplifier configured from the first transconductance amplifier 31, the second transconductance amplifier 32 and the transimpedance amplifier 33 is lower in the first measurement mode than in the second measurement mode. The amplification factor of the output signal from the vertical-magnetic-field sensor can accordingly be made lower than that of the output signal from the horizontal-magnetic-field sensor.

According to the magnetic sensor circuit 104 of the present embodiment high-speed operation and operation under respective setting of differential level for the common-mode input/output potential can be made. Benefit of high-speed signal processing at low-voltage operation can be obtained.

In the present embodiment the configuration in which the amplification factors of the first measurement mode and the second measurement mode are switched by switching the respective impedance of the first feedback circuit A1 and the second feedback circuit A2 has been explained. A configuration in which the impedance of the connection circuit B is switched as in the magnetic sensor circuit 102 according to the third embodiment can also be applied.

Although the embodiments of the present invention have been descried above in detail with reference to the drawings, specific configurations are not limited to the embodiments. The present invention can be appropriately modified as appropriate within the scope not departing from the spirit of the present invention. The configurations described in the respective embodiments described above may be combined.

What is claimed is:
1. A magnetic sensor circuit comprising:
a vertical-magnetic-field sensor providing a differential voltage corresponding to a vertical magnetic field;
a horizontal-magnetic-field sensor providing a differential voltage corresponding to a horizontal magnetic field;
a first operational amplifier;

a second operational amplifier;

a first switch connected between one of output terminals of the vertical-magnetic-field sensor and one of input terminals of the first operational amplifier;

a second switch connected between another one of output terminals of the vertical-magnetic-field sensor and one of input terminals of the second operational amplifier;

a third switch connected between one of output terminals of the horizontal-magnetic-field sensor and the one of input terminals of the first operational amplifier;

a fourth switch connected between another one of output terminals of the horizontal-magnetic-field sensor and the one of input terminals of the second operational amplifier;

a first feedback circuit connected between an output terminal of the first operational amplifier and another one of input terminals of the first operational amplifier;

a second feedback circuit connected between an output terminal of the second operational amplifier and another one of input terminals of the second operational amplifier;

a connecting circuit connected between the other one of input terminals of the first operational amplifier and the other one of input terminals of the second operational amplifier;

a control circuit configured to control a switching between a first measurement mode for measuring the vertical magnetic field and a second measurement mode for measuring the horizontal magnetic field; and at least any one of a fifth switch configured to switch an impedance of the first feedback circuit, a sixth switch configured to switch an impedance of the second feedback circuit, and a seventh switch configured to switch an impedance of the connecting circuit, in the first measurement mode the control circuit
connecting the one of output terminal of the vertical-magnetic-field sensor and the one of input terminals of the first operational amplifier with the first switch,
connecting the other one of output terminals of the vertical-magnetic-field sensor and the one of input terminals of the second operational amplifier with the second switch, and
controlling a switching of at least any one of the fifth switch, the sixth switch, and the seventh switch, and in the second measurement mode the control circuit
connecting the one of output terminal of the horizontal-magnetic-field sensor and the one of input terminals of the first operational amplifier with the third switch,
connecting the other one of output terminals of the horizontal-magnetic-field sensor and the one of input terminals of the second operational amplifier with the fourth switch, and
controlling a switching of at least any one of the fifth switch, the sixth switch, and the seventh switch.

2. The magnetic sensor circuit according to claim 1, wherein the control circuit controls a switching of at least any one of the fifth switch, the sixth switch, and the seventh switch in order that each of an amplification factor of the first operational amplifier and an amplification factor of the second operational amplifier are different in the first measurement mode and in the second measurement mode respectively.

3. A magnetic sensor circuit comprising:
a vertical-magnetic-field sensor providing a differential voltage corresponding to a vertical magnetic field;
a horizontal-magnetic-field sensor providing a differential voltage corresponding to a horizontal magnetic field;
a first transconductance amplifier;
a first switch connected between one of output terminals of the vertical-magnetic-field sensor and one of input terminals of the first transconductance amplifier;
a second switch connected between another one of output terminals of the vertical-magnetic-field sensor and another one of input terminals of the first transconductance amplifier;
a third switch connected between one of output terminals of the horizontal-magnetic-field sensor and the one of input terminals of the first transconductance amplifier;
a fourth switch connected between another one of output terminals of the horizontal-magnetic-field sensor and the other one of input terminals of the first transconductance amplifier;
a transimpedance amplifier having one of input terminals to which the one of output terminals of the first transconductance amplifier is connected, and having another one of input terminals to which the other one of the output terminals of the first transconductance amplifier is connected;
a second transconductance amplifier having one of output terminals which is connected to the other one of input terminals of the transimpedance amplifier, and having another one of output terminals which is connected to the one of the input terminals of the transimpedance amplifier;
a first feedback circuit connected between one of output terminal of the transimpedance amplifier and one of input terminals of the second transconductance amplifier;
a second feedback circuit connected between another one of output terminal of the transimpedance amplifier and another one of input terminals of the second transconductance amplifier;
a connecting circuit connected between the one of input terminals of the second transconductance amplifier and the other one of input terminals of the second transconductance amplifier;
a control circuit configured to control a switching between a first measurement mode for measuring the vertical magnetic field and a second measurement mode for measuring the horizontal magnetic field; and
at least any one of a fifth switch configured to switch an impedance of the first feedback circuit, a sixth switch configured to switch an impedance of the second feedback circuit, and a seventh switch configured to switch an impedance of the connecting circuit,
in the first measurement mode the control circuit
connecting the one of output terminal of the vertical-magnetic-field sensor and the one of input terminals of the first transconductance amplifier with the first switch,
connecting the other one of output terminals of the vertical-magnetic-field sensor and the other one of input terminals of the first transconductance amplifier with the second switch, and
controlling a switching of at least any one of the fifth switch, the sixth switch, and the seventh switch, and
in the second measurement mode the control circuit
connecting the one of output terminal of the horizontal-magnetic-field sensor and the one of input terminals of the first transconductance amplifier with the third switch, connecting the other one of output terminals of the horizontal-magnetic-field sensor and the other one of input terminals of the first transconductance amplifier with the fourth switch, and controlling a switching of at least any one of the fifth switch, the sixth switch, and the seventh switch.

4. The magnetic sensor circuit according to claim 3, wherein the control circuit controls a switching of at least any one of the fifth switch, the sixth switch, and the seventh switch in order that each of an amplification factor of the first operational amplifier and an amplification factor of the second operational amplifier are different in the first measurement mode and in the second measurement mode respectively.

* * * * *